(12) United States Patent
Wang et al.

(10) Patent No.: US 9,472,780 B2
(45) Date of Patent: Oct. 18, 2016

(54) ORGANIC ELECTROLUMINESCENT DISPLAY DEVICE AND DISPLAY APPARATUS

(71) Applicant: BOE Technology Group Co., Ltd., Beijing (CN)

(72) Inventors: Long Wang, Beijing (CN); Qinghui Zeng, Beijing (CN); Xuan He, Beijing (CN); Xue Gao, Beijing (CN); Fei Liu, Beijing (CN); Yunping Di, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/409,818

(22) PCT Filed: May 16, 2014

(86) PCT No.: PCT/CN2014/077620
§ 371 (c)(1),
(2) Date: Dec. 19, 2014

(87) PCT Pub. No.: WO2015/085711
PCT Pub. Date: Jun. 18, 2015

(65) Prior Publication Data
US 2015/0357597 A1  Dec. 10, 2015

(30) Foreign Application Priority Data

Dec. 10, 2013 (CN) .......................... 2013 1 0667653

(51) Int. Cl.
*H01L 51/52* (2006.01)
*H01L 51/56* (2006.01)
(Continued)

(52) U.S. Cl.
CPC ......... *H01L 51/5253* (2013.01); *H01L 27/323* (2013.01); *H01L 51/0097* (2013.01);
(Continued)

(58) Field of Classification Search
CPC ........... H01L 51/5253; H01L 51/0097; H01L 27/323; H01L 51/524; H01L 51/5281; H01L 51/56; H01L 2251/5338; Y02E 10/549
See application file for complete search history.

(56) References Cited

U.S. PATENT DOCUMENTS

2011/0279895 A1* 11/2011 Koh .................. B29C 55/026
                                                     359/487.02
2013/0163081 A1*  6/2013 Cho .................... G02B 5/3025
                                                     359/485.03

FOREIGN PATENT DOCUMENTS

CN    102207574 A    10/2011
CN    102798921 A    11/2012
(Continued)

OTHER PUBLICATIONS

International Search Report and Written Opinion for PCT Application No. PCT/CN2014/077620, dated Sep. 11, 2014, 10 pages.
(Continued)

*Primary Examiner* — John P Dulka
(74) *Attorney, Agent, or Firm* — Westman, Champlin & Koehler, P.A.

(57) ABSTRACT

The present invention discloses an organic electroluminescent display device and a display apparatus comprising a substrate, an organic electroluminescent pixel array disposed on the substrate, and a package film coated on an outside of the organic electroluminescent pixel array. The organic electroluminescent display device further comprises an optical film laminate body at a light output side thereof; and the optical film laminate body is a preformed integral component including a plurality of functional film layers. Since the optical film laminate body including the plurality of functional film layers can be bonded on organic electroluminescent display device by a single film-bonding process, it simplifies the manufacturing process, decreases the cost, reduces the thickness, and improves the flexibility of the organic electroluminescent display device. In addition, the present invention also discloses a display apparatus comprising the organic electroluminescent display device.

5 Claims, 5 Drawing Sheets

(51) Int. Cl.
*H01L 51/00* (2006.01)
*H01L 27/32* (2006.01)
(52) U.S. Cl.
CPC ......... *H01L51/524* (2013.01); *H01L 51/5281* (2013.01); *H01L 51/56* (2013.01); *H01L 2251/5338* (2013.01); *Y02E 10/549* (2013.01)

(56) References Cited

FOREIGN PATENT DOCUMENTS

| | | | |
|---|---|---|---|
| CN | 202615345 U | | 12/2012 |
| CN | 202615345 U | * | 12/2012 |
| CN | 102903735 A | | 1/2013 |
| CN | 102916034 A | | 2/2013 |
| CN | 102916034 A | * | 2/2013 |
| CN | 102956671 A | | 3/2013 |
| CN | 103207426 A | | 7/2013 |
| CN | 103364861 A | | 10/2013 |
| CN | 103682154 A | | 3/2014 |
| JP | 2001-208912 A | | 8/2001 |
| JP | 2007-25202 A | | 2/2007 |
| KR | 10-2010-0008203 A | | 1/2010 |

OTHER PUBLICATIONS

First Office Action for Chinese Patent Application No. 201310667653.0, dated Aug. 5, 2015, 14 pages.

English translation of Box No. V from the Written Opinion for the International Searching Authority for PCT Application No. PCT/CN2014/077620, 2 pages.

* cited by examiner

ORGANIC ELECTROLUMINESCENT DISPLAY DEVICE AND DISPLAY APPARATUS

CROSS-REFERENCE TO RELATED APPLICATION

This Application is a Section 371 National Stage Application of International Application No. PCT/CN2014/077620, filed 16 May 2014, which has not yet published, which claims priority to Chinese Application 201310667653.0, filed Dec. 10, 2013, in Chinese, the contents of which are hereby incorporated by reference in their entirety.

BACKGROUND OF THE INVENTION

1. Field of the Invention

The present invention relates to a display technical field, more particularly, relates to an organic electroluminescent display device and a display apparatus.

2. Description of the Related Art

Generally, an organic electroluminescent display device (OLED), compared with a traditional liquid crystal display device (LCD), possesses many advantages, such as, fast response, wide color gamut, ultra-thin thickness, flexibility, and so on. Thereby, the organic electroluminescent display device has gradually become a current main trend in display field.

The organic electroluminescent display device mainly comprises a substrate and an organic electroluminescent pixel array disposed on the substrate. Each of the organic electroluminescent pixel arrays includes an anode, a cathode opposite to the anode, and a light-emitting layer disposed between the anode and the cathode. When electrons in the cathode and electron holes in the anode are combined in the light-emitting layer, an organic material in the light-emitting layer is excited to emit a light. In this way, the organic electroluminescent display device emits the light. Unfortunately, in the organic electroluminescent display device, the organic material in the light-emitting layer and an active metal forming the cathode both are extremely sensitive to moisture and oxygen. Thereby, the organic electroluminescent display device must be packaged more reliably than other display devices. If the organic electroluminescent display device is not reliably packaged, the moisture and oxygen in the surrounding environment penetrate into the display device. As a result, the cathode metal is oxidized, and the organic material of the light-emitting layer is deteriorated. In this case, it shortens the service lifetime of the organic electroluminescent display device, or directly causes a fatal damage and affects the use of the organic electroluminescent display device.

Currently, the medium and small size of organic electroluminescent display device is often packaged by a glass cover, and the flexible or large sized organic electroluminescent display device is simply packaged by a thin film, and then covered by a waterproof and anti-oxygen film. Furthermore, in order to ensure the display contrast and visibility, a circular polarizer film may be bonded on the waterproof oxygen film to prevent the ambient light from being reflected by the organic electroluminescent display device. In addition, as for a touch organic electroluminescent display device, it may also need to dispose a touch control film between the waterproof oxygen film and the circular polarizer film. FIG. 1 shows the illustrative structure of a touch organic electroluminescent display device. As shown in FIG. 1, the touch organic electroluminescent display device comprises a substrate 1, an organic electroluminescent pixel array 2, a package film 3, a waterproof oxygen film 4, a touch control film 5 and a circular polarizer film 6.

As described above, the current packaging for the flexible or large sized organic electroluminescent display device may comprise bonding films three times, which will cause the packaging process complicated and increase the cost. Furthermore, bonding films three times may increase the thickness of the flexible organic electroluminescent display device, leading to a problem that the organic electroluminescent display device cannot be easily curved.

SUMMARY OF THE INVENTION

The present invention has been made to overcome or alleviate at least one aspect of the above mentioned disadvantages.

In order to solve the above problems, that the packaging process is very complicated, that the cost is high, and that the organic electroluminescent display device cannot be easily curved, caused by bonding films three times in the prior art. According to an object of the present invention, there is provided an organic electroluminescent display device and a display apparatus with simple manufacturing process and low cost as well as excellent flexibility.

According to an aspect of the present invention, there is provided an organic electroluminescent display device, comprising: a substrate; an organic electroluminescent pixel array disposed on the substrate; and a package film coated on an outside of the organic electroluminescent pixel array, wherein the organic electroluminescent display device further comprises an optical film laminate body at a light output side thereof; and wherein the optical film laminate body is a preformed integral component including a plurality of functional film layers.

According to an exemplary embodiment of the present invention, the optical film laminate body comprising: a circular polarizer film layer; a protective film layer located at a light input side of the circular polarizer film layer; and a bonding layer located at a light output side of the circular polarizer film layer.

According to another exemplary embodiment of the present invention, the optical film laminate body further comprising: a first waterproof and anti-oxidation film layer disposed between the light output side of the circular polarizer film layer and the bonding layer; and/or a second waterproof and anti-oxidation film layer disposed between the light input side of the circular polarizer film layer and the protective film layer.

According to another exemplary embodiment of the present invention, the optical film laminate body further comprising: a touch control film layer disposed between the light output side of the circular polarizer film layer and the bonding layer or between the light input side of the circular polarizer film layer and the protective film layer.

According to another exemplary embodiment of the present invention, the bonding layer is bonded on the light output side of the organic electroluminescent display device.

According to another exemplary embodiment of the present invention, the circular polarizer film layer comprises a phase difference film layer, a polarizing functional film layer and a support film layer that are laminated sequentially; and the phase difference film layer forms the light output side of the circular polarizer film layer, the support film layer forms the light input side of the circular polarizer film layer, and the polarizing functional film layer is located between the phase difference film layer and the support film layer.

According to another exemplary embodiment of the present invention, the polarizing functional film layer is made of polyvinyl alcohol or carbon nanotubes.

According to another exemplary embodiment of the present invention, the circular polarizer film layer comprises a phase difference film layer and a polarizing functional film layer; and the phase difference film layer forms the light output side of the circular polarizer film layer, and the polarizing functional film layer forms the light input side of the circular polarizer film layer.

According to another exemplary embodiment of the present invention, the polarizing functional film layer is made of carbon nanotubes.

According to another exemplary embodiment of the present invention, the touch control film layer is made of carbon nanotubes.

According to another exemplary embodiment of the present invention, the touch control film layer is disposed between the light input side of the circular polarizer film layer and the protective film layer; and the circular polarizer film layer is configured to be a phase difference film layer.

According to another exemplary embodiment of the present invention, the package film is located at the light output side of the organic electroluminescent display device, and the substrate is located at the light input side of the organic electroluminescent display device; and the optical film laminate body is disposed on an outside surface of the package film.

According to another exemplary embodiment of the present invention, the package film is located at the light input side of the organic electroluminescent display device, and the substrate is located at the light output side of the organic electroluminescent display device; and the optical film laminate body is disposed on an outside surface of the substrate.

According to another aspect of the present invention, there is provided a method of manufacturing an organic electroluminescent display device, comprising steps of:

preforming an optical film laminate body including a plurality of functional film layers; and bonding the optical film laminate body on a light output side of an organic electroluminescent pixel array of the organic electroluminescent display device.

According to an exemplary embodiment of the present invention, the optical film laminate body comprising: a circular polarizer film layer comprising a phase difference film layer, a polarizing functional film layer and a support film layer that are laminated sequentially; a protective film layer located at a light input side of the circular polarizer film layer; and a waterproof and anti-oxidation film layer, a bonding layer and a touch control film layer located at a light output side of the circular polarizer film layer.

According to another exemplary embodiment of the present invention, said preforming an optical film laminate body including a plurality of functional film layers comprising: bonding a phase difference film layer, a polarizing functional film layer and a support film layer together, wherein the polarizing functional film layer is disposed between the phase difference film layer and the support film layer; depositing a waterproof and anti-oxidation film layer on an outside of the phase difference film layer, and forming a bonding layer on the waterproof and anti-oxidation film layer by pouring an adhesive on the waterproof and anti-oxidation film layer; and bonding a touch control film layer on the support film layer, and bonding a protective film layer on an outside of the touch control film layer.

According to another exemplary embodiment of the present invention, the above method further comprising: soaking and tensing the phase difference film layer, the polarizing functional film layer and the support film layer, respectively, before bonding them together.

According to another exemplary embodiment of the present invention, a peelable layer is bonded on the bonding layer after forming the bonding layer; and the peelable layer is removed from the bonding layer to expose the bonding layer before bonding the optical film laminate body.

According to another exemplary embodiment of the present invention, the polarizing functional film layer is made of polyvinyl alcohol or carbon nanotubes.

According to another aspect of the present invention, there is provided a display apparatus comprising the organic electroluminescent display device according to any one of the above embodiments.

DETAILED DESCRIPTION OF PREFERRED EMBODIMENTS OF THE INVENTION

Figure 1:
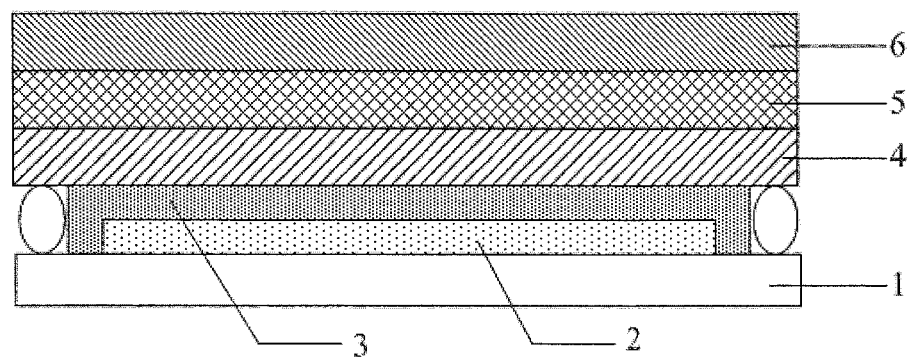
FIG. 1 is an illustrative structure view of an organic electroluminescent display device in prior art.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

According to a general concept of the present invention, there is provided an organic electroluminescent display device, comprising: a substrate; an organic electroluminescent pixel array disposed on the substrate; and a package film coated on an outside of the organic electroluminescent pixel array, wherein the organic electroluminescent display device further comprises an optical film laminate body at a light output side thereof; and the optical film laminate body is a preformed integral component including a plurality of functional film layers.

Hereafter, it will describe an organic electroluminescent display device and a display apparatus, according to embodiments of the present invention, with reference to drawings.

Please be noted that each layer of film layer of the organic electroluminescent display device shown in the drawings is only used to illustratively describe contents of the invention and thicknesses of the film layers do not reflect actual size scale thereof.

Figure 2A:
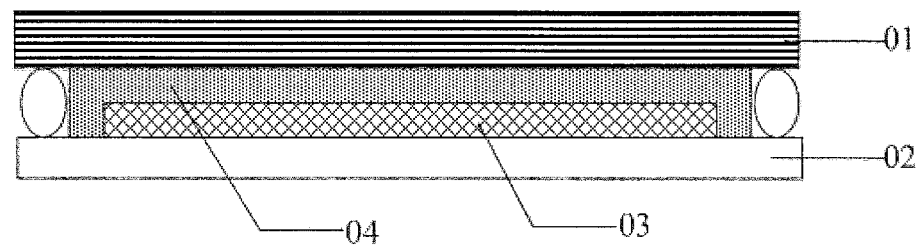
FIG. 2a and FIG. 2b each shows an illustrative structure view of an organic electroluminescent display device according to an exemplary embodiment of the present invention.
Figure 2B:
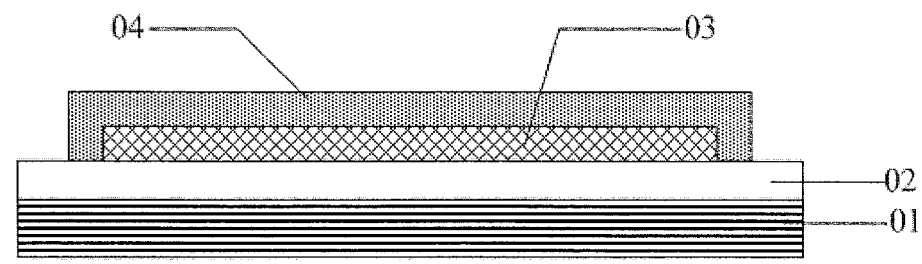

In an exemplary embodiment of the present invention, there is provided an organic electroluminescent display device. As shown in FIG. 2a and FIG. 2b, the organic electroluminescent display device comprises a substrate 02, an organic electroluminescent pixel array 03 disposed on the substrate 02, and a package film 04 coated on an outside of the organic electroluminescent pixel array 03. Also, the organic electroluminescent display device further comprises an optical film laminate body 01 (the detailed structure of the optical film laminate body 01 is not shown in FIG. 2a and FIG. 2b) at a light output side thereof. FIGS. 3a to 3g show the detailed structure of the optical film laminate body 01. As shown in FIG. 3, the optical film laminate body 01 comprises a circular polarizer film layer 001, a protective film layer 002 located at a light input side of the circular polarizer film layer 001, and a bonding layer 003 located at a light output side of the circular polarizer film layer 001, a waterproof and anti-oxidation film layer 004, and a touch control film layer 005;

the waterproof and anti-oxidation film layer 004 may be disposed between the light output side of the circular polarizer film layer 001 and the bonding layer 003 and/or between the light input side of the circular polarizer film layer 001 and the protective film layer 002;

the touch control film layer 005 may be disposed between the light output side of the circular polarizer film layer 001 and the bonding layer 003 or between the light input side of the circular polarizer film layer 001 and the protective film layer 002; and the bonding layer 003 is bonded on the light output side of the organic electroluminescent display device.

In the above organic electroluminescent display device provided by the embodiments of the present invention, the optical film laminate body 01 is provided at the light output side of the organic electroluminescent display device. Since the optical film laminate body 01 comprises the circular polarizer film layer 001, the waterproof and anti-oxidation film layer 004 and the touch control film layer 005, the optical film laminate body 01 possesses an anti-reflection function, a good waterproof and anti-oxidation function and a touch control function. Thereby, compared with the OLED in the prior art, the OLED provided in the embodiments of the present invention may solve the problems of the OLED in the prior art, that it is necessary to bond a waterproof and anti-oxidation film layer, a circular polarizer film layer and a touch control film layer, only by a single film-bonding process. Therefore, the present invention reduces the difficulty to manufacture the organic electroluminescent display device. In addition, the organic electroluminescent display device has many advantages of lighter weight, thinner thickness, lower cost and better displaying effect, etc. Furthermore, it can avoid a problem that a flexible organic electroluminescent display device cannot be easily curved due to larger thickness.

Specifically, in the above organic electroluminescent display device provided by the embodiments of the present invention, as shown in FIG. 2a, the light output side of the organic electroluminescent display device is located at a side of the package film 04, that is, the organic electroluminescent display device is a top emission type of organic electroluminescent display device, and the optical film laminate body 01 is disposed above the package film 04.

In an alternative embodiment, in the above organic electroluminescent display device provided by the embodiments of the present invention, as shown in FIG. 2b, the light output side of the organic electroluminescent display device is located at a side of the substrate, that is, the organic electroluminescent display device is a bottom emission type of organic electroluminescent display device, and the optical film laminate body 01 is disposed above the substrate 02.

Also, in the above organic electroluminescent display device provided by the embodiments of the present invention, as shown in FIGS. 3a, 3d, 3e, 3f and 3g, in the optical film laminate body 01, the waterproof and anti-oxidation film layer 004 is preferably disposed between the light output side of the circular polarizer film layer 001 and the bonding layer 003. In this case, the waterproof and anti-oxidation film layer 004 is located near the organic electroluminescent pixel array in the organic electroluminescent display device, so that it can better protect the organic electroluminescent pixel array from water and oxygen.

Figure 3A:
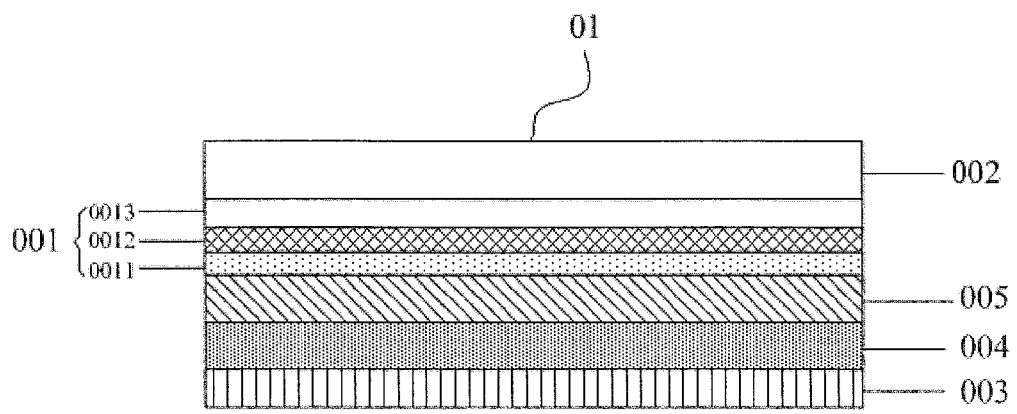
FIG. 3a to FIG. 3g each shows an illustrative structure view of an optical film laminate body according to an exemplary embodiment of the present invention.
Figure 3B:
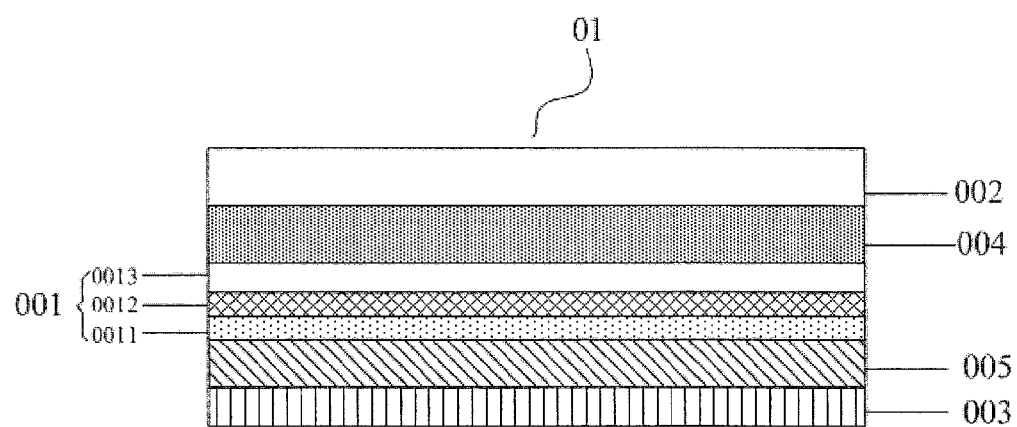

Of course, when embodying specifically, in the above organic electroluminescent display device provided by the embodiments of the present invention, as shown in FIG. 3b, the waterproof and anti-oxidation film layer 004 may be disposed between the light input side of the circular polarizer film layer 001 and the protective film layer 002, which is not limited herein.

Please be noted that if the waterproof and anti-oxidation film layer 004 is located closer to the protective film layer 002 and farther away from the organic electroluminescent pixel array in the organic electroluminescent display device, the effect of the waterproof and anti-oxidation film layer 004 protecting the organic electroluminescent pixel array from water and oxygen becomes poorer. Thereby, the waterproof and anti-oxidation film layer 004 should be disposed closer to the bonding layer 003 as possible during designing the optical film laminate body 01.

Figure 3C:
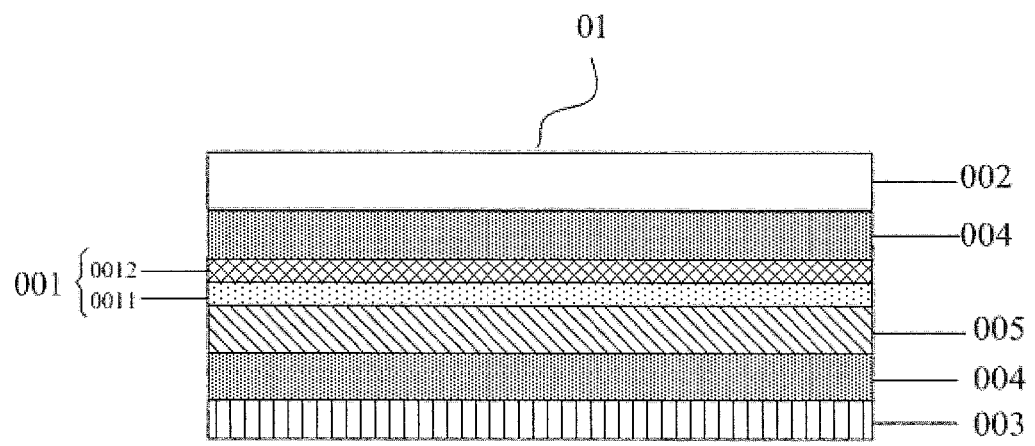

Preferably, in order to further improve the effect of the waterproof and anti-oxidation film layer 004 protecting the organic electroluminescent pixel array from water and oxygen, in the above organic electroluminescent display device provided by the embodiments of the present invention, a plurality of waterproof and anti-oxidation film layers 004 may be disposed in the optical film laminate body 01. As shown in FIG. 3c, waterproof and anti-oxidation film layers 004 may be disposed between the light output side of the circular polarizer film layer 001 and the bonding layer 003, and between the light input side of the circular polarizer film layer 001 and the protective film layer 002. On one hand, in this case, it can doubly protect the organic electroluminescent pixel array in the organic electroluminescent display device from water and oxygen. On the other hand, it also increases the total thickness of the organic electroluminescent display device. Thereby, the number of the waterproof and anti-oxidation film layers 004 may be depended on actual requirements.

Furthermore, in the above organic electroluminescent display device provided by the embodiments of the present invention, as shown in FIG. 3c, if both sides of the circular polarizer film layer 001 are provided with the waterproof and anti-oxidation film layers 004, respectively, the waterproof and anti-oxidation film layers 004 on both sides of the circular polarizer film layer 001 may have the same structure, but the present invention is not limited to this, the waterproof and anti-oxidation film layers 004 on both sides of the circular polarizer film layer 001 may have different structures.

Specifically, in the above organic electroluminescent display device provided by the embodiments of the present invention, the waterproof and anti-oxidation film layer 004 may be made of inorganic metal or oxide. Preferably, the waterproof and anti-oxidation film layer 004 may be made of $Al_2O_3$, $TiO_2$, $SiN_x$, $SiC$ or any combination thereof. The thickness of the waterproof and anti-oxidation film layer 004 may be preferably controlled in a range of 10 nm~100 um.

Specifically, in the above organic electroluminescent display device provided by the embodiments of the present invention, if the touch control film layer 005 is disposed between the light output side of the circular polarizer film layer 001 and the bonding layer 003, as shown in FIGS. 3*a*, 3*b*, 3*c* and 3*e*, the touch control film layer 005 is preferably disposed between the light output side of the circular polarizer film layer 001 and the waterproof and anti-oxidation film layer 004. In this case, it can avoid the light from being reflected by the touch control film layer 005. Also, in this case, the waterproof and anti-oxidation film layer 004 is disposed closer to the organic electroluminescent pixel array in the organic electroluminescent display device, therefore, it can improve the effect of the waterproof and anti-oxidation film layer 004 protecting the organic electroluminescent pixel array from water and oxygen. Of course, the touch control film layer 005 may be disposed between the waterproof and anti-oxidation film layer 004 and the bonding layer 003.

Figure 3D:
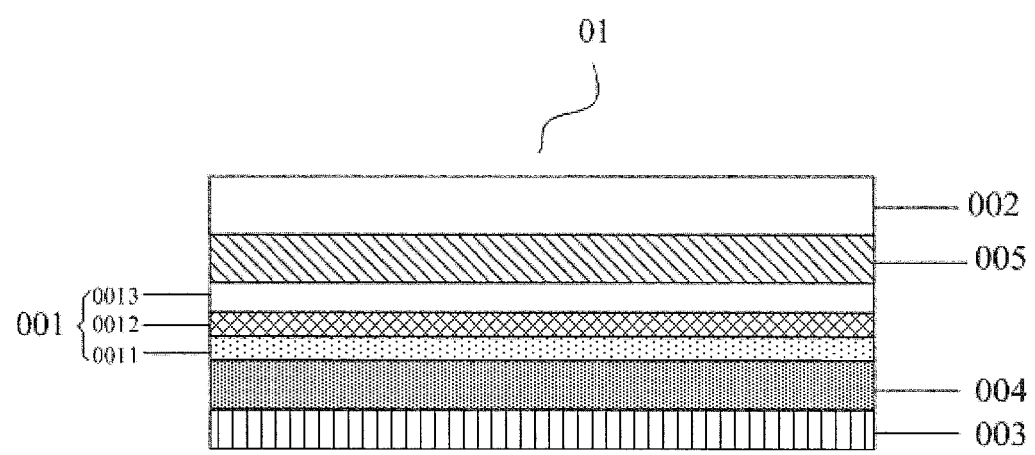
Figure 3E:
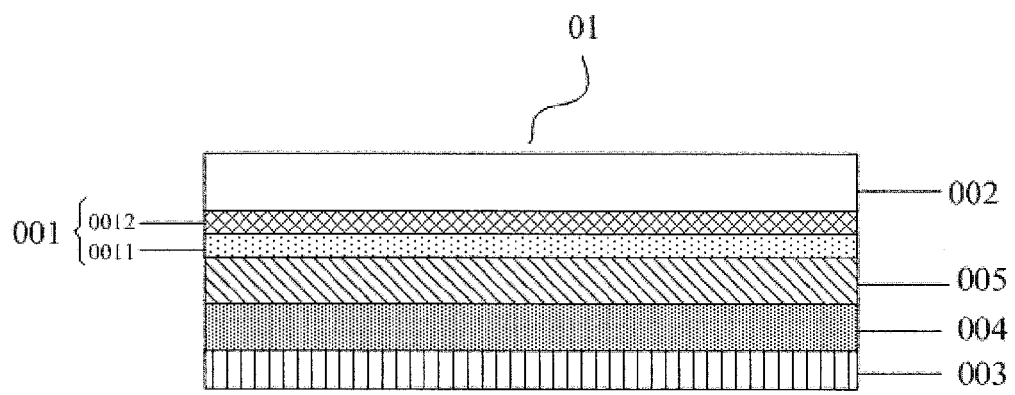
Figure 3F:
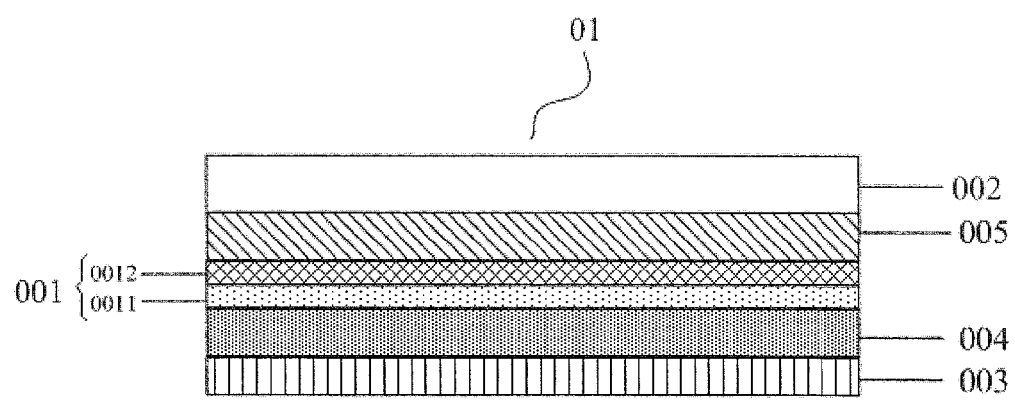
Figure 3G:
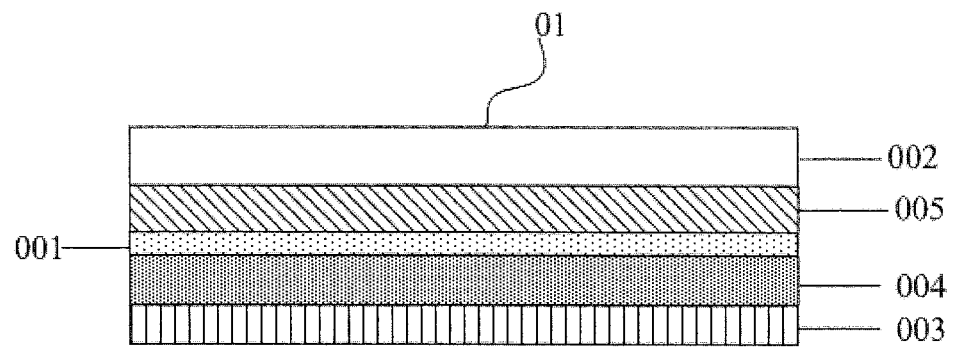

Specifically, in the above organic electroluminescent display device provided by the embodiments of the present invention, as shown in FIGS. 3*d*, 3*f* and 3*g*, the touch control film layer 005 may be disposed between the light input side of the circular polarizer film layer 001 and the protective film layer 002, which is not limited herein.

Specifically, in the above organic electroluminescent display device provided by the embodiments of the present invention, the circular polarizer film layer 001 mainly plays a role to prevent the reflected light from passing therethrough, as shown in FIGS. 3*a*, 3*b* and 3*d*, the circular polarizer film layer 001 may comprise a phase difference film layer 0011, a polarizing functional film layer 0012 and a support film layer 0013 that are laminated sequentially. The phase difference film layer 0011 forms the light output side of the circular polarizer film layer 001, the support film layer 0013 forms the light input side of the circular polarizer film layer 001.

Specifically, the support film layer 0013 mainly plays a role to support and protect the polarizing functional film layer 0012. The polarizing functional film layer 0012 mainly used to convert a natural light passing through the polarizing functional film layer 0012 into a linearly polarized light. The phase difference film layer 0011 may be preferably selected as a ¼ wavelength retarding plate and mainly used to convert a linearly polarized light passing through the phase difference film layer 0011 into a circularly polarized light or convert a circularly polarized light passing through the phase difference film layer 0011 into a linearly polarized light. The polarizing functional film layer 0012 and the phase difference film layer 0011 are bonded together. Consequently, a natural light incident into the polarizing functional film layer 0012 is converted into a first linearly polarized light passing through the polarizing functional film layer 0012, then the linearly polarized light enters into the phase difference film layer 0011 and is converted into a left-handed circularly polarized light, then the left-handed circularly polarized light is reflected back and converted into a right-handed circularly polarized light, then the right-handed circularly polarized light passes through the phase difference film layer 0011 again and is converted into a second linearly polarized light. In this case, the second linearly polarized light is perpendicular to the first linearly polarized light. Thereby, the second linearly polarized light cannot pass through a linear polarizer, and the reflection light cannot pass through the polarizing functional film layer 0012, thereby decreasing the disadvantageous effect resulted from the environment light and improving the contrast of the display device.

Specifically, in the above organic electroluminescent display device provided by the embodiments of the present invention, the polarizing functional film layer may be made of, but not limited to, polyvinyl alcohol (PVA) or carbon nanotubes (CNT).

Furthermore, in the above organic electroluminescent display device provided by the embodiments of the present invention, if the polarizing functional film layer 0012 is made of polyvinyl alcohol, the PVA material may be modified to have a hydrophobic function. In this way, it not only can prevent the polarizing functional film layer from being hydrolyzed, but also improve the polarizing function of the polarizing functional film layer. Meanwhile, it also can protect the organic electroluminescent pixel array.

Specifically, in the above organic electroluminescent display device provided by the embodiments of the present invention, if the polarizing functional film layer 0012 is made of carbon nanotubes, the polarizing functional film layer may be composed of 10~30 layers of super paramagnetic carbon nanotube films that are laminated. In each layer of the super paramagnetic carbon nanotube film, the carbon nanotubes with uniform size are connected end to end in an extension direction of the carbon nanotube and arranged in the same preferred orientation.

Furthermore, comparing a polarizing functional film layer made of the carbon nanotubes with a polarizing functional film layer made of polyvinyl alcohol, since the super paramagnetic carbon nanotubes has a homogeneous absorption characteristics on various wavelengths of lights, withstands high temperature and high humidity, and possesses excellent flexibility and light transmittance, the polarizing functional film layer made of carbon nanotubes is not only adapted to the general organic electroluminescent display device and the flexible display device, but also may be used under high temperature, high humidity and other harsh conditions. Furthermore, the carbon nanotube has self support ability, thereby, in a case where the polarizing functional film layer in the circular polarizer film layer is made of carbon nanotubes, the support film layer may be omitted, further simplifying the structure and manufacture of the organic electroluminescent display device.

In this way, if the polarizing functional film layer in the circular polarizer film layer is made of carbon nanotubes, in the above organic electroluminescent display device provided by the embodiments of the present invention, as shown in FIGS. 3*c*, 3*e* and 3*f*, the circular polarizer film layer 001 comprises only the phase difference film layer 0011 and the polarizing functional film layer 0012. The phase difference film layer 0011 forms the light output side of the circular polarizer film layer 001, and the polarizing functional film layer 0012 forms the light input side of the circular polarizer film layer 001. The polarizing functional film layer 0012 is made of carbon nanotubes.

Specifically, when embodying, a carbon nanotube array is obtained by chemical vapor deposition method, and then a super paramagnetic carbon nanotube film is obtained by pulling the carbon nanotube array with a tension tool. Furthermore, the polarizing functional film layer made of the carbon nanotubes may be controlled to have a thickness in a range of 10 μm~100 μm.

Preferably, in the above organic electroluminescent display device provided by the embodiments of the present invention, the touch control film layer may be made of made of carbon nanotubes. In this way, compared with an ITO (Indium Tin Oxide) film, the carbon nanotube film is more flexible, it is helpful to manufacture the flexible organic electroluminescent display device. But the present invention is not limited to this, the touch control film layer may be made of ITO.

Specifically, in the above organic electroluminescent display device provided by the embodiments of the present invention, if the touch control film layer is made of carbon nanotubes, the touch control film layer may be composed of 10~30 layers of super paramagnetic carbon nanotube films that are laminated. In each layer of the carbon nanotube film, the carbon nanotubes with uniform size are connected end to end in an extension direction of the carbon nanotube and arranged in the same preferred orientation. The touch control film layer may be made of a common carbon nanotube film, and then formed as a touch control sensor member with a special pattern.

Preferably, in the above organic electroluminescent display device provided by the embodiments of the present invention, in a case where the touch control film layer is made of carbon nanotubes, since the super paramagnetic carbon nanotubes has the polarizing effect, the touch control film layer 005 made of carbon nanotubes may be disposed between the light input side of the circular polarizer film layer 001 and the protective film layer 002, as shown in FIG. 3g. Meanwhile, the circular polarizer film layer 001 comprises the phase difference film layer. In this way, the touch control film layer 005 can have the touch control function as well as the polarizing function. If the touch control film layer 005 is combined with the phase difference film layer, it also can have the anti-reflection function. In this case, the polarizing functional film layer in the circular polarizer film layer may be omitted, and it further reduces the weight and thickness of the organic electroluminescent display device.

Furthermore, in the above organic electroluminescent display device provided by the embodiments of the present invention, the organic electroluminescent pixel array may comprise a plurality of organic electroluminescent units composed of an anode, a cathode, and a light-emitting layer disposed between the anode and the cathode. Specifically, the organic electroluminescent pixel array may have a common structure in the prior art, and the description about it is omitted herein.

Specifically, in the above organic electroluminescent display device provided by the embodiments of the present invention, the optical film laminate body may be manufactured in a roll-to-roll manner. Hereafter, it will describe the method of manufacturing the organic electroluminescent display device by taking the optical film laminate body shown in FIG. 3d as an example.

Figure 4:
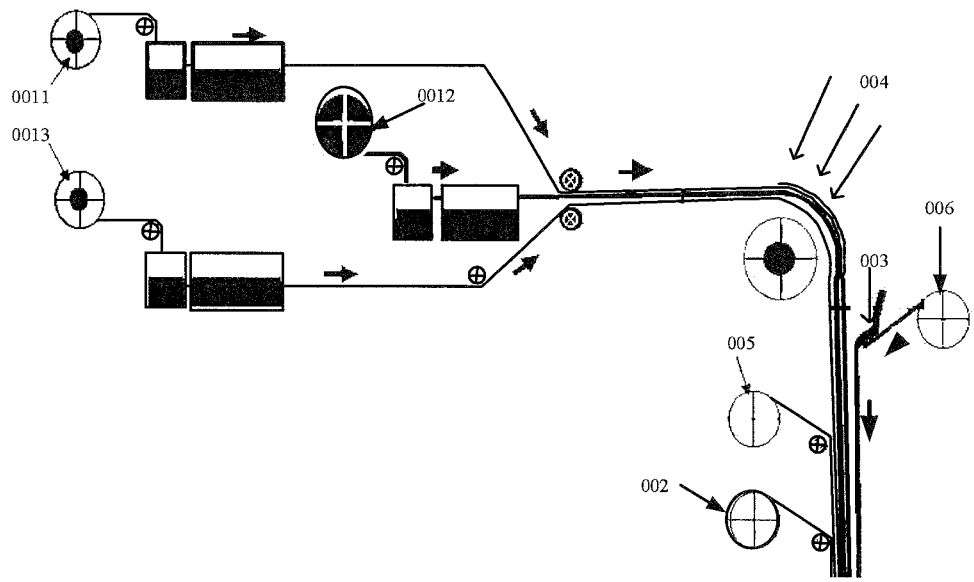
FIG. 4 shows a roll-to-roll manner in a method of manufacturing an optical film laminate body according to an exemplary embodiment of the present invention.

Specifically, the process to manufacture the optical film laminate body shown in FIG. 3d in the roll-to-roll manner is shown in FIG. 4.

Firstly, soaking and tensing a phase difference film layer 0011, a polarizing functional film layer 0012 and a support film layer 0013, respectively, and bonding them together in the roll-to-roll manner;

Thereafter, depositing a waterproof and anti-oxidation film layer 004 on a side of the phase difference film layer 0011;

Thereafter, pouring an adhesive on a side of a peelable layer 006 to be bonded with the waterproof and anti-oxidation film layer 004;

Bonding the peelable layer 006 on a side which is deposited with the waterproof and anti-oxidation film layer 004 deposited, while forming the bonding layer 003 between the waterproof and anti-oxidation film layer 004 and the peelable layer 006;

Bonding a touch control film layer 005 on a side of the support film layer 0013 in the roll-to-roll manner; and Bonding a protective film layer 002 on a side of the touch control film layer 005 in the roll-to-roll manner.

In this way, the optical film laminate body 01 is finished.

Please be noted that the peelable layer is not shown in FIG. 3d, because the object of manufacturing the peelable layer is to protect the bonding layer in the optical film laminate body which is bonded on a front side of the organic electroluminescent display device, and the peelable layer 006 will be removed so that the bonding layer may be directly bonded on the light output side of the organic electroluminescent display device when bonding the optical film laminate body to the organic electroluminescent display device.

According to the same concept of the present invention, the present invention further provides a display apparatus comprising the organic electroluminescent display device according to any one of above embodiments. Since the principle that the display apparatus solves problems is the same as that in the above the organic electroluminescent display device, the embodiments of the display apparatus may refer to the embodiments of the organic electroluminescent display device, and is omitted herein.

The organic electroluminescent display device and the display apparatus provided by the embodiments of the present invention, comprises the substrate, the organic electroluminescent pixel array disposed on the substrate, and the package film coated on the outside of the organic electroluminescent pixel array. The organic electroluminescent display device further comprises the optical film laminate body at the light output side thereof. Since the optical film laminate body comprises the circular polarizer film layer, the waterproof and anti-oxidation film layer and the touch control film layer, the optical film laminate body possesses an anti-reflection function, a good waterproof and anti-oxidation function and a touch control function. Thereby, compared with the organic electroluminescent display device in the prior art, the organic electroluminescent display device provided by the embodiments of the present invention may solve the problems of the organic electroluminescent display device in the prior art, only by a single film-bonding process, that is, bonding a waterproof and anti-oxidation film layer, a circular polarizer film layer and a touch control film layer, respectively. Therefore, the present invention reduces the difficulty to manufacture the organic electroluminescent display device. In addition, the organic electroluminescent display device of the embodiments of the present invention has many advantages of, such as, lighter weight, thinner thickness, lower cost and better displaying effect, etc. Furthermore, it can effectively avoid a problem that a flexible organic electroluminescent display device cannot be easily curved due to larger thickness.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A method of manufacturing an organic electroluminescent display device, comprising steps of:
preforming an optical film laminate body including a plurality of functional film layers, wherein the optical film laminate body comprises a circular polarizer film layer, a protective film layer located at a light input side of the circular polarizer film layer, a bonding layer located at a light output side of the circular polarizer film layer, a waterproof and anti-oxidation film layer disposed between the light output side of the circular polarizer film layer and the bonding layer or between the light input side of the circular polarizer film layer and the protective film layer, and a touch control film layer disposed between the light output side of the circular polarizer film layer and the bonding layer or between the light input side of the circular polarizer film layer and the protective film layer;

disposing an organic electroluminescent pixel array on a substrate;

coating a package film on an outside of the organic electroluminescent pixel array; and bonding the preformed optical film laminate body on an outside surface of the package film or an outside surface of the substrate by means of the bonding layer of the preformed optical film laminate body.

2. The method according to claim 1, wherein the circular polarizer film layer comprises a phase difference film layer, a polarizing functional film layer and a support film layer that are laminated sequentially;

the phrase difference film layer forms the light output side of the circular polarizer film layer, the support film layer forms the light input side of the circular polarizer film layer, the polarizing functional film layer is located between the phase difference film layer and the support film layer.

3. The method according to claim 2, wherein the polarizing functional film layer is made of polyvinyl alcohol or carbon nanotubes.

4. The method according to claim 1, wherein the step of preforming an optical film laminate body including a plurality of functional film layers comprising steps of:

bonding a phase difference film layer, a polarizing functional film layer and a support film layer together, wherein the polarizing functional film layer is disposed between the phase difference film layer and the support film layer;

depositing a waterproof and anti-oxidation film layer on an outside of the phase difference film layer, and forming a bonding layer on the waterproof and anti-oxidation film layer by pouring an adhesive on the waterproof and anti-oxidation film layer; and bonding a touch control film layer on the support film layer, and bonding a protective film layer on an outside of the touch control film layer.

5. The method according to claim 4, wherein a peelable layer is bonded on the bonding layer after forming the bonding layer; and the peelable layer is removed from the bonding layer to expose the bonding layer before bonding the optical film laminate body.

* * * * *